United States Patent
Chen et al.

(10) Patent No.: US 6,214,151 B1
(45) Date of Patent: Apr. 10, 2001

(54) THERMAL DYE TRANSFER PROCESS FOR PREPARING OPTO-ELECTRONIC DEVICES

(75) Inventors: Jianping Chen, San Jose; Jesse Richard Salem, Cupertino; John Campbell Scott, Los Gatos, all of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/434,996

(22) Filed: Nov. 5, 1999

(51) Int. Cl.$^7$ .......................... B44C 1/165; B32B 31/20; B32B 15/08; B03C 8/10; H01J 1/62

(52) U.S. Cl. .......................... 156/240; 156/230; 156/247; 427/146; 427/147; 427/148; 428/690; 428/914; 428/917; 430/200; 430/202; 430/252; 430/311; 313/504; 313/505; 313/506

(58) Field of Search .......................... 156/230, 231, 156/235, 239, 240, 241, 243, 277, 289; 427/146, 147, 148, 64, 68, 77, 108; 428/195, 914, 690, 917; 430/197, 200, 201, 202, 203, 252, 254, 273.1, 271.1, 311, 312, 319; 313/504, 505, 506

(56) References Cited

U.S. PATENT DOCUMENTS

| | | | |
|---|---|---|---|
| 4,950,950 | * | 8/1990 | Perry et al. ........................... 313/504 |
| 5,688,551 | * | 11/1997 | Littman et al. ........................ 427/64 |
| 5,707,745 | | 1/1998 | Forrest et al. . |
| 5,739,545 | | 4/1998 | Guha et al. . |
| 5,817,242 | | 10/1998 | Biebuyck et al. . |
| 5,851,709 | | 12/1998 | Grande et al. . |
| 5,932,517 | | 8/1999 | Wen et al. . |
| 6,114,088 | * | 9/2000 | Wolk et al. ........................ 430/273.1 |

FOREIGN PATENT DOCUMENTS

WO 97/48115  12/1997  (WO).
WO 97/48139  12/1997  (WO).

OTHER PUBLICATIONS

Pschenitzka et al. (1999), "Three–Color Organic LightEmitting Diodes Patterned by Masked Dye Diffusion," *Applied Physics Letters* 74(13):1913–1915. Sep. 22, 1998.

Tang et al. (1989), "Electroluminescence of Doped Organic Thin Films," *J. Applied Phys.* 65(9):3610–3616. Jun. 1, 1989.

Wang et al. (1999), "Mico–Contact Printing Approaches to Organic Light–Emitting Diode Pixels," *Polymer Preprints* 40:1248–1249.

Hebner et al. (1998), "Local Tuning of Organic Light–Emitting Diode Color by Dye Droplet Application," *Applied Physics Letters* 73(13):1775–1777. Sep. 28, 1998.

\* cited by examiner

*Primary Examiner*—Richard Crispino
*Assistant Examiner*—J. A. Lorengo
(74) *Attorney, Agent, or Firm*—Louis L. Wu; Reed & Associates

(57) ABSTRACT

A method is described for preparing opto-electronic devices such as organic light-emitting diodes. The method is a thermal dye transfer process in which a dye pattern is transferred from a dye transfer plate into a receiving layer of a substrate by bringing the dye transfer plate into contact with the receiving layer and heating to a relatively low temperature, preferably below the vaporization or sublimation temperature of the dye. The pattern of the dye is maintained upon transfer and diffusion. Preferably, the method is repeated to provide a three-color pattern in the receiving layer. The invention also encompasses an opto-electronic device comprising a receiving layer as prepared by the aforementioned method wherein the receiving layer is sandwiched between two electrodes, one of which is transparent. Optionally, a hole-transporting or electron-transporting layer can be deposited between each electrode and the receiving layer.

20 Claims, 3 Drawing Sheets

Heat & Press First Ink Transfer Plate

Remove First Ink Transfer Plate

THERMAL DYE TRANSFER PROCESS FOR PREPARING OPTO-ELECTRONIC DEVICES

TECHNICAL FIELD

This invention relates generally to processes for preparing opto-electronic devices, and more particularly relates to a thermal dye transfer process and its use in the manufacture of optoelectronic devices such as organic light-emitting diodes.

BACKGROUND

Organic light-emitting diodes ("OLEDs") have demonstrated potential for applications in flat-panel displays due to the OLEDs' high luminescent efficiency, low driving voltage, large viewing angle, light weight, simple device fabrication, and potential low cost. See generally, U.S. Pat. No. 5,707,745 to Forrest et al. A typical OLED structure comprises one or more layers of organic materials sandwiched between a transparent anode such as a thin film of indium tin oxide ("ITO") on a glass substrate and a metal cathode. When a direct current is applied between the anode and the cathode, holes and electrons are injected in the organic layers from the anode and cathode, respectively, and radiatively recombine, emitting light. Such an OLED structure and method of forming thereof are disclosed in PCT Publication No. WO 97/48139, directed to OLED structures and methods that allow for multiple colors to be integrated into a single substrate.

For color displays, red, green and blue emitters or "pixels" are typically required. Because of the size of the pixels in high resolution screens, it is impractical to deposit individual OLED pixels on a surface. However, the emission color of OLEDs can be changed through the incorporation of relatively small quantities of luminescent dyes into the host organic layers containing light-emitting materials. Therefore, closely positioned yet distinctly colored light emitters may be patterned by depositing a continuous layer of an OLED material on a surface followed by precise positioning and imparting small amounts of differently colored dyes to the layer. In other words, the color of an OLED display can be locally "tuned" by patterning the dye material without disturbing the OLED material. This concept has been demonstrated by introducing luminescent dyes locally using inkjet printing techniques. See, e.g., Hebner et al. (1998) Appl. Phys. Lett. 73: 1775–77. However, inkjet printing and other methods in which a separate dye droplet has to be applied for each individual pixel will limit the manufacturing rate of such displays. In addition, organic materials do not generally withstand conventional photolithographic processing in which solvents are used.

Thus, an improved method of introducing a dye pattern into an organic thin film over a large area, without resorting to sequential introduction of color into each individual pixel, is clearly desirable. One such method of patterning involves a hybrid stamp structure as described in U.S. Pat. No. 5,817,242 to Biebuyck et al. This patent describes a stamp is where a patterned layer is provided that can easily adhere or absorb a specific ink. If the ink contains an organic solvent, the stamp containing the solvent-based ink cannot be used to transfer the ink on to a receiving layer that may be adversely affected by the solvent.

Another method of introducing a dye pattern to an organic thin film over a large area is described in Pschenitzka et al. (1999), "Three-Color Organic Light-Emitting Diodes Patterned by Masked Dye Diffusion," Appl. Phys. Lett. 74: 1913–15. This reference describes diffusion by using a large area dye-doped polymer layer as the diffusion source. A patterned masking layer is sandwiched between the dye source plate and a substrate containing the receiving layer for OLED fabrication. By applying heat, the dye vaporizes or sublimes and thus deposits on and diffuses into the receiving layer in the desired pattern.

However, this thermal transfer method suffers from two main drawbacks. First, to effect dye transfer, the diffusion source must be heated to at least the vaporization or sublimation temperature of the dye. Because the dye source plate is in physical contact with a patterned mask which, in turn, is in contact with the film, thermal conduction would likely result in the receiving layer being heated to roughly the temperature of the diffusion source. Such excess heating will alter the microstructure or morphology of the film and may even damage the film. In particular, if the film already contains another dye pattern, that dye pattern will migrate due to elevated processing temperature and thus compromise the resolution of the final product. Second, because the mask necessarily has a thickness, the resulting resolution of the deposited dye pattern is further limited due to geometrical limitations on vapor transport from the dye source to the film.

SUMMARY OF THE INVENTION

Accordingly, it is an object of the invention to provide a process for imparting a dye pattern into a receiving layer of a substrate as in the manufacture of opto-electronic devices including OLEDs, which process overcomes the above-mentioned disadvantages in the art.

It is another object of the invention to provide such a process wherein the dye pattern is imparted into a receiving layer of a substrate at a temperature that is no greater than the vaporization or sublimation temperature of the dye.

Additional objects, advantages and novel features of the invention will be set forth in part in the description which follows, and in part will become apparent to those skilled in the art upon examination of the following, or may be learned by practice of the invention.

In one aspect, the invention comprises a method for imparting a dye pattern into a receiving layer, the method comprising: (a) providing a substrate having a receiving layer thereon wherein the receiving layer comprises a light-emitting material; (b) providing a first dye transfer plate having a first dye composition on a first dye transfer surface thereof in the form of a first pattern, wherein the first dye composition contains a first dye; (c) bringing the first dye transfer plate and the substrate together such that the receiving layer and the dye transfer surface are in contact; and (d) heating the first dye transfer plate and the receiving layer to a first temperature to effect diffusion of the first dye into the receiving layer. Preferably, the method further comprises repeating steps (a) through (d) with a differently colored luminescent dye. It is also preferred that the dye transfer plate be compliant and for a conformal contact the the receiving layer and that the temperature used to effect diffusion of dye into the receiving layer not exceed the vaporization or sublimation temperature of the dye, in order to avoid compromising the resolution of the dye pattern formed in the receiving layer.

A particularly preferred use of the aforementioned method is in a color pixelation process for preparing an organic light-emitting diode. In such a case, the diode comprises a patterned, colored receiving layer formed by the aforementioned method sandwiched between first and second electrodes. The substrate can serve as the first electrode if the substrate is an electrically conductive material. Otherwise, the substrate further includes an electrode layer comprising an electrically conductive material wherein the first electrode layer is interposed between the substrate and the receiving layer. Optionally, hole-transporting or electron-transporting layers can be deposited between the first or second electrodes and the receiving layer. When holes and electrons are injected into the receiving layer by passing current through the electrodes, light is emitted thus forming a diode. Preferably, either the substrate and its electrode layer or the other electrode are optically transparent to transmission of the emitted light therethrough for opto-electronic applications.

In another aspect of the invention, an apparatus is provided for imparting a dye pattern into a receiving layer present on a substrate surface, i.e., for carrying out the above-described method. The apparatus comprises: (a) a first dye transfer plate having a first dye composition thereon in a first pattern wherein the composition comprises a first dye; (b) a substrate having a receiving layer thereon; (c) means for bringing the first dye transfer plate and the substrate together such that the receiving layer and the dye transfer surface are in contact; and (d) means for heating the first transfer plate and the receiving layer to a first temperature to effect diffusion of the first dye into the receiving layer.

BRIEF DESCRIPTION OF THE FIGURES

The invention is described in detail below with reference to the following drawings and graph.

DETAILED DESCRIPTION OF THE INVENTION

Before describing the invention in detail, it must be noted that, as used in this specification and the appended claims, the singular forms "a," "an," and "the" include plural referents unless the context clearly dictates otherwise. Thus, for example, reference to "a dye" includes more than one dye, reference to "a layer" or "a polymeric layer" includes multiple layers, reference to "an electrode" includes multiple electrodes.

The present invention is in part direct to a process where a light-emitting layer is patterned by bringing into contact: (1) a dye transfer surface of a dye transfer plate, wherein the surface has a dye-containing composition thereon in the form of a pattern; and (2) a receiving layer on a substrate surface wherein the receiving layer comprises a light-emitting material. Heating effects dye diffusion into the light-emitting layer in a patternwise manner. It is preferred that the contact is both intimate and conformal for optimal results. By employing contact diffusion, it is unnecessary to heat the dye to its vaporization or sublimation temperature since contact diffusion can occur at lower temperatures. The lower temperature leads to better resolution of the resulting dye pattern on the light-emitting layer. A three-colored patterned light-emitting layer potentially of use in color flat-screen displays can be fashioned through two successive contact dye transfer operations.

Figure 1A:
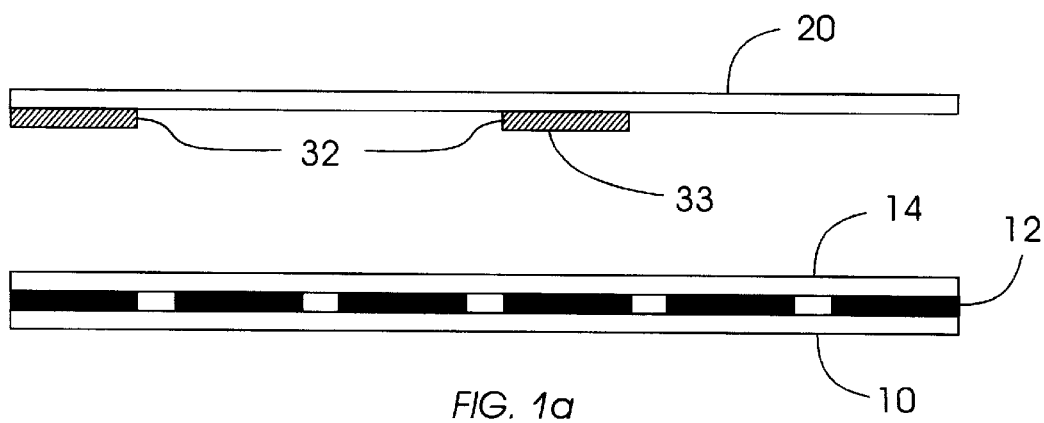
FIGS. 1A–1F schematically illustrate basic steps of a process for imparting a dye pattern according to the invention.
Figure 1B:
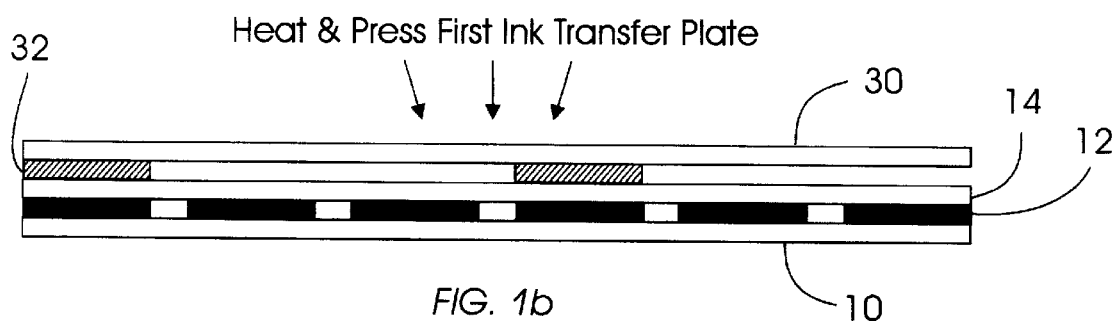
Figure 1C:
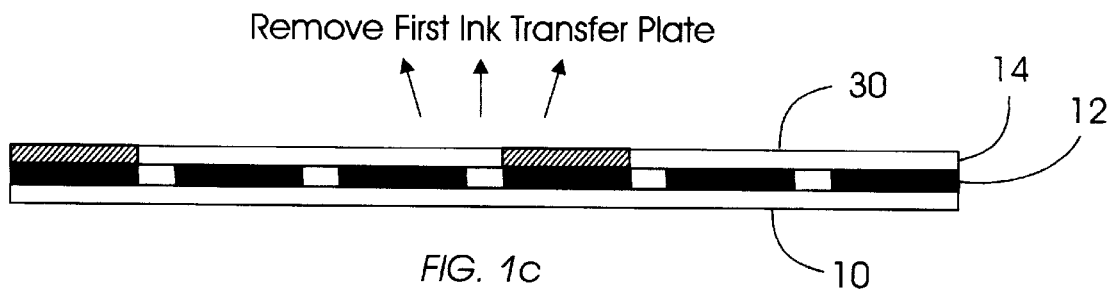

The invention is now described in detail herein with reference to the figures. Referring to FIG. 1A, a substrate 10 having a receiving layer 14 thereon is provided wherein the receiving layer 14 comprises a light-emitting material. A first electrode layer 12 is interposed between the substrate 10 and the receiving layer. The receiving layer 14 is also a light-emitting layer. A first dye transfer plate 30 has a first dye composition 32 on a first dye transfer surface 33 in a first pattern wherein the first dye composition 32 contains a first dye. The pattern of the first dye composition 32 is transferred to the receiving layer 14 by effecting contact diffusion of the first dye into the receiving layer 14. Referring to FIG. 1B, diffusion is achieved by bringing together the first dye transfer plate 30 and the substrate 10 such that first dye transfer surface 33 containing the first dye composition 32 comes in contact with the receiving layer 14. Heat is then applied to bring the first dye composition 32 and receiving layer 14 to a first temperature. Preferably, the first temperature is no greater or considerably lower than the vaporization or sublimation temperature of the dye, to avoid exposing the receiving layer 14 to excessive heat. Excessive heat may promote the unwanted migration of the dye in receiving layer 14 thereby compromising the resolution of the final product. Heating may be achieved through different methods such as the use of a radiative heat source, by bringing a source of heat in thermal contact with the dye transfer plate or by other means known to the ordinary practitioner of the art. Referring to FIG. 1C, if the receiving layer 14 originally contains only one color, this process results in a receiving layer 14 with two color regions. It will be also apparent that components such as the substrate and the dye transfer plate must be capable of withstanding processing temperatures.

Figure 1D:
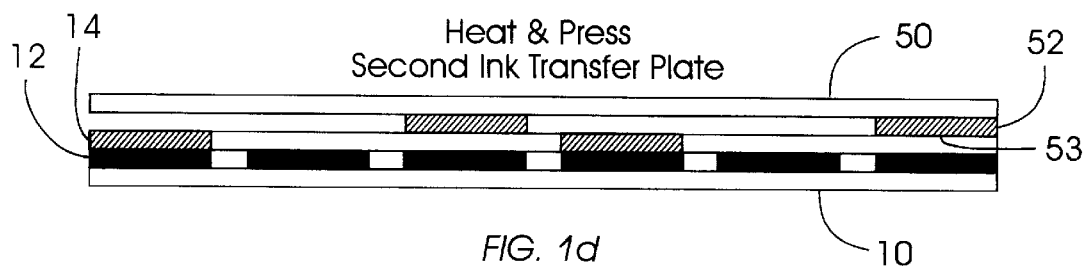
Figure 1E:
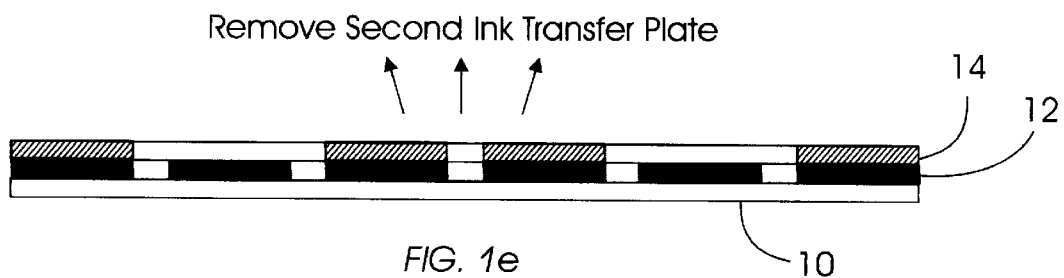
Figure 1F:
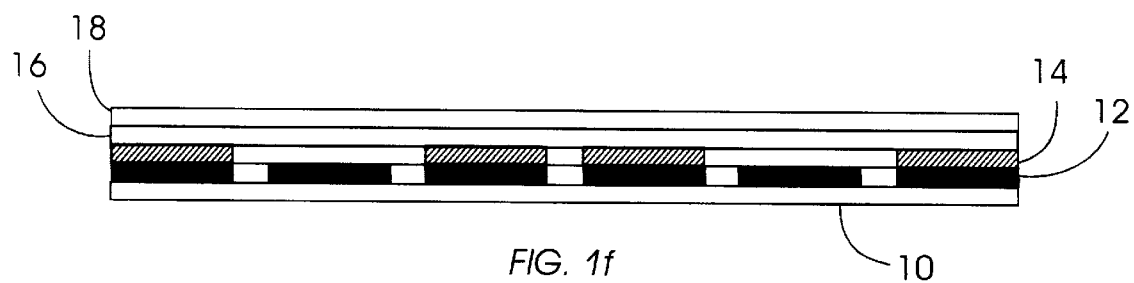

Referring to FIG. 1D, a preferred embodiment of the present invention additionally provides a second dye transfer plate 50 having a second dye composition 52 on second transfer surface 53 in a second pattern wherein the second dye composition 52 comprises second dye. After the first dye transfer plate 30 is removed from the receiving layer 14, the second dye transfer surface 53 containing the second dye composition 52 is brought into contact with the receiving layer 14. The second dye composition 52 and the receiving layer 14 are then heated to a second temperature. Referring to FIG. 1E, diffusion of the second dye into the receiving layer 14 is thus effected. Because dye migration in the receiving layer 14 tends to increase as the temperature of the receiving layer 14 increases, the second temperature is preferably no greater than the first temperature. This embodiment of the invention results in a receiving layer 14 with a pattern of three colors. It will be apparent to those skilled in the art that to fabricate a film useful for a color flat screen display, care must be taken in the Patterning of the first and second dye compositions and in the alignment of the first and second dye transfer plates with the receiving film to produce the desired pattern. Once a three-color pattern is achieved, second electrode layer 18 deposited on the receiving layer 14 to form an opto-eletronic display device. Optionally, a hole or electron transport material 16 is disposed between the receiving layer 14 and the second electrode layer 18.

The light-emitting material of the receiving layer may comprise any number of organic compounds. These light-emitting materials may comprise relatively simple organic compounds to complex polymers or copolymers. In the case of polymers or copolymers, the molecular structure may comprise a car bon-based or silicon-based backbone. The polymers and copolymers may be linear, branched, crosslinked or any combinations thereof, and may have a wide range of molecular weights from as low as about 5000 to more than 1,000,000. In the case of copolymers, the copolymers may be alternating, block, random, graft, or combinations thereof. These materials may be hole-transporting or electron-transporting materials. Examples of suitable light-emitting materials useful in conjunction with the present invention include, but are not limited to: poly (dialkoxyphenylenevinylene), poly(thiophene), poly (phenylene), poly(paraphenylene), poly(paraphenylene vinylene), phenylacetylene, N-vinylcarbazole, polyaniline, poly(3-alkylthiophene), poly(3-octylthiophene), poly (alkylflorene) and various derivatives thereof. Preferably, the light-emitting material of the receiving layer comprises a blue emitting polymer, for example, a poly (dialkylfluorene) such as poly(dihexylfluorene).

It is desirable to produce a red, green and blue pattern on the receiving layer 14 for color flat-panel display applications. While the receiving layer 14 can be any color, including red or green, the preferred color of the receiving layer 14 before processing is blue. This can be achieved by using a blue light-emitting material or by incorporating a blue dye in a light-emitting material. Various blue emitting materials have demonstrated their suitability for use as a blue light-emitting material. For example, U.S. Pat. No. 5,731,599 to Hwang et al. discloses a blue emitting conjugated polymer having phenylene residues substituted by a silicon-containing group in the main chain. In addition, each of poly(paraphenylene) and poly(vinylcarbazole), under proper conditions where holes and electrons are injected therein, can also emit blue light. For the present invention, the preferred blue emitting material comprises poly (dihexylfluorene).

When the light-emitting material of the receiving layer is blue, one of the first and second dyes is red and the other is green. Whether the first or the second dye is red depends on the temperature needed to diffuse the first and second dyes. Any one of the first, second or third dyes may be organic or organometallic. Organic and organometallic luminescent dyes are preferred due to their wide range of available colors and because organic dyes can undergo contact diffusion at relatively low temperatures. Numerous examples of dyes are disclosed in U.S. Pat. No. 5,851,709 to Grand et al. and include the following: phthalocyanines, such as Pigment Blue 15, nickel phthalocyanine, chloroaluminum phthalocyanine, hydroxy aluminum phthalocyanine, vanadyl phthalocyanine, titanyl phthalocyanine, and titanyl tetrafluorophthalocyanine; isoindolinones, such as Pigment Yellow 110 and Pigment Yellow 173; isoindolines, such as Pigment Yellow 139 and Pigment Yellow 185; benzimidazolones, such as Pigment Yellow 151, Pigment Yellow 154, Pigment Yellow 175, Pigment Yellow 194, Pigment Orange 36, Pigment Orange 62, Pigment Red 175, and Pigment Red 208; quinophthalones, such as Pigment Yellow 138; quinacridones, such as Pigment Red 122, Pigment Red 202, and Pigment Violet 19; perylenes, such as Pigment Red 123, Pigment Red 149, Pigment 179, Pigment Red 224, and Pigment Violet 29; dioxazines, such as Pigment Violet 23; thioindigos, such as Pigment Red 88, and Pigment Violet 38; epindolidiones, such as 2,8-difluoroepindolidione; anthanthrones, such as Pigment Red 168; isoviolanthrones, such as isoviolanthrone; indanthrones, such as Pigment Blue 60; imidazobenzimidazolones, such as Pigment Yellow 192; pyrazoloquinazolones, such as Pigment Orange 67; diketopyrrolopyrroles, such as Pigment Red 254, Irgazin DPP RubinTR, Cromophtal DPP OrangeTR; Chromophtal DPP Flame Red FP (all of Ciba-Geigy); and bisaminoanthrones, such as Pigment Red 177. Of the aforementioned dyes, light-emitting dyes are preferred over light absorbing or pigment containing dyes. Examples of light-emissive organic host materials and of fluorescent dyes include: 2-methyl-8-hydroquinoline aluminum; 8-hydroquinoline aluminum; coumarins, pyrromethines, acridines; quinolone; carbostyryls; flurols; phenoxazenes; rhodamines; fluoresceins; and many others. In selecting a suitable light-emissive dye, color and luminescent efficiency are two important factors. Luminescent dyes found particularly suitable for display applications include coumarin-540 which produces a green emission, pyrromethene-546 which also produces a green emission, 4-(dicyanoethylne)-2-nmethyl-6-(p-dimethylamino styryl)-4-H-pyran which produces a red-orange emission and Lumogeng F-300, a perylene-based dye which produces a red emission.

Preferably, the first and second dye compositions comprise a polymeric material to provide controlled release of the incorporated dye. Such polymeric materials include poly(styrene), poly(amides), poly(imides), poly(esters), poly(carbonates), poly(acrylic acids), (polymethacrylic acids) and various acrylate and methacrylate-based polymers and copolymers. The preferred polymeric material comprises poly(methylmethacrylate). These dye compositions can be prepared in a number of ways depending on the dye and the polymeric material. For example, a dye may be added to a photoresist resin, spun on the substrate, and exposed and developed. Alternatively, a photoresist may be patterned to the dye carrier and swelled in a solution containing a dye and a solvent. Upon drying, the dye remains in the carrier.

The dye transfer plates of the present invention have a dye composition on a dye transfer surface thereof in the form of a pattern. Generally, it will be apparent to those skilled in the art that to fabricate a film useful for a flat screen display, the pattern of the dye composition must correspond with the positions of associated pixels of the display. More specifically, a pixel in an opto-electronic device such as a flat screen display comprises three subpixels, typically red, green and blue. The pattern corresponds to the position of the subpixels for one color.

To form such a pattern on the dye transfer surface, masking is usually involved. There are at least two approaches involving the use masking techniques. The first approach is to mask the surface, deposit the ink composition, and remove the mask to reveal the patterned ink composition. The second approach is to deposit the ink composition, mask the composition, etch away exposed areas, and remove the mask to reveal the patterned composition. Both approaches are well known in the art of semiconductor processing.

A preferred approach involves the preparation of a compliant plate or stamp comprising an elastomer such as poly(dimethylsiloxane) patterned on the surface with a relief image. The dye may be provided on the surface of the stamp. In the alternative, the elastomer can be impregnated with the dye by providing a solution dye of dissolving in a solvent, soaking the elastomer in the solution, removing the elastomer from the solution and evaporating the solvent solution. Or the dye may be doped into a second polymer phase disposed within the hollows of the dye stamp. Where the dye is provided solely on the surface of the stamp, the surface of may be modified such that sufficient solid-phase wetting of the surface by the dye may occur. In other words, after surface modification, the dye preferentially adheres to the surface.

Because the substrate 10 or the optional first electrode layer may later serve as an anode or a cathode of a color flat-panel display through which light is to be emitted, the substrate 10 is preferably optically transparent and electrode layer 12 of the substrate is preferably both electrically conductive and optically transparent. In addition, the substrate should have sufficient strength to withstand mechanical handling associated display manufacture and use. Thus, suitable substrate materials include ceramics such as silicate and other glasses, silicon oxides, aluminum oxides and polymers such as poly(esters), poly(carbonates), poly (sulfones) and poly(methylmethacrylates). Glass is preferred due to its low cost and high degree of optical transparency.

The first electrode layer can be quite thin and may comprise a semiconductive or conducting material whose work function is modified by plasma treatment. See, e.g., PCT Publication No. WO 97/48115 to Sturm et al. Because many materials are optically transparent if they are sufficiently thin, conductive materials include metals, ceramics and polymers. Each of these three materials has its own advantages or drawbacks. For example, metals generally have the highest electrical conductivity but are optically opaque unless they are deposited in a very thin film, typically only hundreds of angstroms or less in thickness. In addition, the high surface to volume ratio of thin metal layers tends to render the metal layers highly susceptible to oxidation, which in turn decreases electrical conductivity. Thus, if a first electrode layer is comprised of a metal, the metal layer would preferably comprise an oxidation-resistant element such as gold, chromium or platinum the thickness of which would only be hundreds of angstroms.

Many ceramics and polymers, on the other hand, can be made more optically transparent than metals and thus tend to be preferred herein. However, ceramics and polymers typically have limited electrical conductivity. Since ceramics tend to have higher electrical conductivity than polymers, the preferred first electrode layer comprises an optically transparent and electrically conductive ceramic material. Such conductive ceramic materials include various metal oxides such as various phases of rhenium oxide, chromium oxide and vanadium oxide. The most preferred first electrode layer comprises indium tin oxide ("ITO"). Patterning of the first electrode layer allows for control of electrical current to each individual colored region formed on the receiving surface.

Optionally, the first electrode layer has a bilayered or multilayered structure where, to enhance luminescence, a hole or electron transport material with relatively low electrical conductivity is deposited on a highly-electrically conductive film. In addition to the light-emitting materials set forth above, examples of hole transport materials include crosslinkable hexyl-triphenylamine. Examples of electron transporting molecules include 2-4-biphenylyl-5-4-tert-butyl-phenyl-1,3,4-oxadiazole.

The receiving layer 14 is typically is less than one micron and preferably less than about 100 nanometers in thickness. In addition, the receiving layer 14 requires only incorporation of 0.1–5.0 wt % of dye relative to the light-emitting material of receiving layer to change the emission color. The first and second dye compositions preferably comprise a high concentration of dye, typically greater than 10% by weight and preferably in the range of 20% to 70% and are preferably 1–5 microns thick. The large amount of dye in the dye transfer plate allows each dye transfer plate to be used several times without severe depletion of the dye concentration in the dye composition.

Once the second dye has diffused into the receiving layer resulting in a three-color film, the second dye plate is removed. Depending on whether the first electrode layer of the substrate is an anode or a cathode, a optional hole or electron transport material is then deposited on the three-color film and another conductor is deposited on the optional hole or electron material to complete an opto-electronic display device. Where the first electrode layer of the substrate comprises patterned ITO and the substrate is optically transparent, a non-transparent metallic layer can be deposited to complete an opto-electronic display device. Methods of deposition include evaporation, sputtering, painting, electroplating and other techniques. Suitable metals include those with low work functions such as calcium, magnesium, beryllium and strontium, aluminum and alloys thereof.

Variations on of the present invention will be apparent to those knowledgeable in the fabrication of OLEDS. For example, the hole and the electron transport layers are optional in that the emitting material may itself transport either holes or electrons or both. The substrate and the corresponding anode or cathode may be opaque in which case the complementary electrode is transparent.

It is to be understood that while the invention has been described in conjunction with the preferred specific embodiments thereof, that the foregoing description as well as the example which follows is intended to illustrate and not limit the scope of the invention. Other aspects, advantages and modifications within the scope of the invention will be apparent to those skilled in the art to which the invention pertains.

All patents, patent applications, and publications mentioned herein are hereby incorporated by reference in their entireties.

EXAMPLE 1

Figure 2:
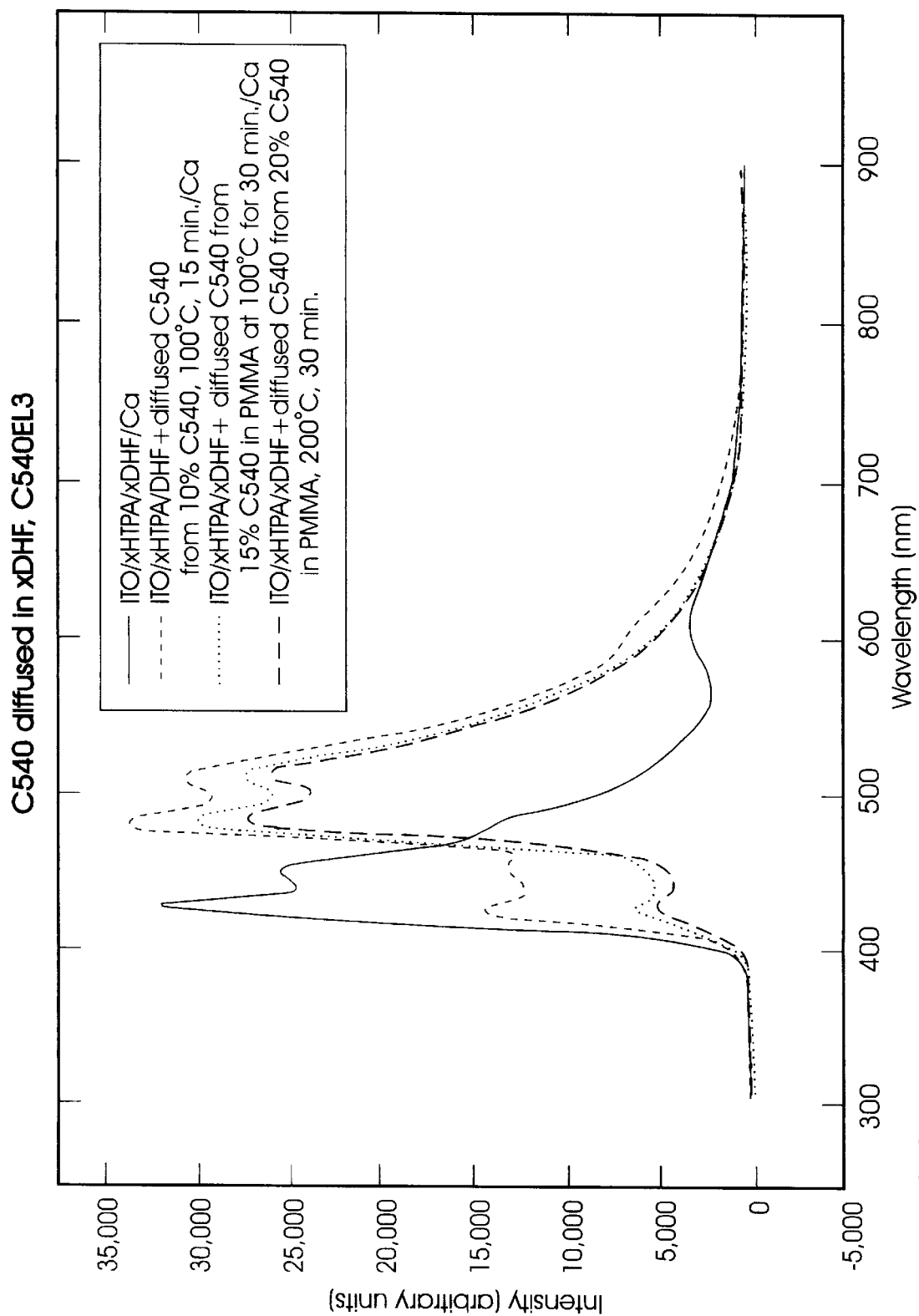
FIG. 2 is a graph illustrating the effects of various process conditions on dye transfer efficiency.

A layer of crosslinkable hexyl-triphenylamine ("xHTPA"), was spin coated and cured on a glass substrate prepatterned with ITO anodes. A receiving layer of light-emitting and crosslinkable polydihexylfluorene ("xDHF") was spin-cast and cured on the xHTPA layer. When this device is finished with a calcium cathode, the poly (dihexylfluorene) emits blue light with a peak wavelength of 420 nm. The emission spectrum is illustrated in FIG. 2.

Then a dye transfer plate consisting of a glass plate was coated with a one micron thick dye composition comprising 10 wt % coumarin-540 dye in polymethylmethacrylate. The dye carrier film was placed against the receiving layer and heated to 100° C. for 15 minutes. A calcium cathode was deposited subsequently on the receiving layer to form a device. A coating of aluminum was deposited on the calcium cathode to protect the calcium, an air sensitive metal. The device exhibited green electroluminescence, with an emission spectrum typical of the coumarin-540 dye, peaking at 490 nm. While residual blue emission remained with the aforementioned heating parameters, longer diffusion times and higher concentration of the dye in the dye composition, as shown in FIG. 2, reduced the intensity of the unwanted blue emission.

EXAMPLE 2

A red emitting device was prepared using a dye-impregnated elastomer stamp by the following procedure. Layers of crosslinked xHTPA and xDHF were spin-coated on an ITO-patterned substrate having a conductivity of 20 ohm/sq as in Example 1. A stamp comprising poly (dimethylsiloxane) ("PDMS") was prepared. A 10:1 ratio (w/w) mixture of Sylgard® silicone elastomer 184 and Sygardg silicone elastomer 184 curing agent was set at room temperature for one hour before spin-coating onto a glass backing plate at 1500 rpm. The PDMS elastomer was cured at 65° C. for one hour. A solution of Phenoxazone-9, an emissive dye, in ethanol (1 wt %) was applied onto a surface PDMS stamp and evaporated. The surface of the PDMS stamp having Phenoxazone-9 thereon was pressed against the xDHF layer of the device and heated at 100° C. for 60 minutes to diffuse the dye into the blue emitting material. After the PDMS stamp was removed from the device, heat was applied for an additional 30 minutes to diffuse the dye further into the host material. A 20 nm electron transport layer of 2-4-biphenylyl-5-4-tert-butyl-phenyl-1,3,4-oxadiazole was then spin cast on the xDHF layer from a cyclohexanone solution (15 mg/ml) at 1500 rpm. A Ca cathode layer and Al protective layer were then vacuum deposited on the electron transport layer to complete the device. When the diode structure was biased in the forward direction, red-orange light was emitted with a peak emission wavelength of 570 nm.

What is claimed is:

1. A process for imparting a dye pattern into a receiving layer comprising the steps of:
   (a) providing a substrate having a receiving layer thereon and a conductive layer interposed between the substrate and the receiving layer, the conductive layer comprising an optically transparent and electrically conductive material, wherein the receiving layer comprises a light-emitting material;
   (b) providing a first dye transfer plate having a first dye composition on a first dye transfer surface thereof in the form of a first pattern, wherein the first dye composition contains a first dye;
   (c) bringing the first dye transfer plate and the substrate together such that the receiving layer and the dye transfer surface arc in contact; and
   (d) heating the first dye transfer plate and the receiving layer to a first temperature to effect diffusion of the first dye into the receiving layer.

2. The process of claim 1 wherein the first temperature is no greater than the vaporization or sublimation temperature of the dye.

3. The process of claim 1 wherein the first dye is luminescent.

4. The process of claim 1 further comprising the steps of:
   (e) providing a second dye transfer plate having a second dye composition on a second dye transfer surface thereof in the form of a second pattern, wherein the first dye composition contains a second dye;
   (f) bringing the second dye transfer plate and the substrate together such that the second dye composition and the dye transfer surface layer are in contact; and
   (g) heating the second dye transfer plate and the receiving layer to a second temperature to effect diffusion of the second dye into the receiving layer.

5. The process of claim 4 wherein the second temperature does not exceed the first temperature.

6. The process of claim 4 wherein the receiving layer further comprises a third dye.

7. The process of claim 4 wherein the receiving layer emits blue.

8. The process of claim 7 wherein the one of the first and second dyes is red and the other is green.

9. The process of claim 1 wherein the optically transparent and electrically conductive material comprises indium tin oxide.

10. The process of claim 1 wherein the first dye composition further comprises a polymeric material.

11. The process of claim 10 wherein the polymeric material comprises poly(methylmethacrylate).

12. The process of claim 10 wherein the polymeric material comprises an elastomer.

13. The process of claim 12 wherein the elastomer is poly(dimethylsiloxane).

14. The process of claim 1 wherein the light-emitting material comprises poly(dihexylfluorene).

15. The process of claim 6 wherein any one of the first, second, and third dyes is organic or organometallic.

16. The process of claim 1 wherein the receiving layer is less than about one micron in thickness.

17. The process of claim 1 wherein the dye composition is substantially thicker than the receiving layer.

18. The process of claim 1 wherein the substrate further comprises an optically transparent material.

19. The process of claim 18 wherein the optically transparent material is glass.

20. A process for imparting a dye pattern into a receiving layer comprising the steps of:
   (a) providing a substrate having a receiving layer thereon, wherein the receiving layer comprises a light-emitting material;
   (b) providing a first dye transfer plate having a first dye composition on a first dye transfer surface thereof in the form of a first pattern, wherein the first dye composition contains a first dye;
   (c) bringing the first dye transfer plate and the substrate together such that the receiving layer and the dye transfer surface are in contact;
   (d) heating the first dye transfer plate and the receiving layer to a first temperature to effect diffusion of the first dye into the receiving layer; and
   (e) placing on the receiving layer a conductive layer comprising an optically transparent and electrically conductive material.

* * * * *